(12) United States Patent
Myoung et al.

(10) Patent No.: US 9,269,926 B2
(45) Date of Patent: Feb. 23, 2016

(54) LASER INDUCED THERMAL IMAGING APPARATUS AND LASER INDUCED THERMAL IMAGING METHOD

(71) Applicant: SAMSUNG DISPLAY CO., LTD., Yongin, Gyeonggi-Do (KR)

(72) Inventors: Seung-Ho Myoung, Yongin (KR); Jin-Hong Jeun, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 295 days.

(21) Appl. No.: 14/065,712

(22) Filed: Oct. 29, 2013

(65) Prior Publication Data

US 2014/0132751 A1    May 15, 2014

(30) Foreign Application Priority Data

Nov. 12, 2012  (KR) ......................... 10-2012-0127505

(51) Int. Cl.
  *H04N 7/18*   (2006.01)
  *H01J 9/00*   (2006.01)
  *H01L 51/56*  (2006.01)
  *B41M 5/382*  (2006.01)
  *H01L 51/00*  (2006.01)

(52) U.S. Cl.
  CPC ........... *H01L 51/56* (2013.01); *B41M 5/38221* (2013.01); *H01L 51/0013* (2013.01)

(58) Field of Classification Search
  CPC ...... H04N 7/18; H01L 51/56; H01L 51/0013; H41M 5/38221
  USPC .............................................. 348/95
  See application file for complete search history.

(56) References Cited

U.S. PATENT DOCUMENTS

2012/0270461 A1* 10/2012 Kim et al. ........... H01L 51/0024
                                                445/24

FOREIGN PATENT DOCUMENTS

KR    10-2006-0044251 A    5/2006
KR    10-0623733 B1    9/2006

* cited by examiner

*Primary Examiner* — Hee-Yong Kim
(74) *Attorney, Agent, or Firm* — Lee & Morse, P.C.

(57) ABSTRACT

A laser thermal imaging apparatus includes a substrate stage configured to receive a substrate, a beam irradiation unit over the substrate stage, the beam irradiation unit being configured to irradiate an alignment laser beam onto an alignment mark of the substrate, and a beam observing unit facing the beam irradiation unit, the substrate stage being interposed between the beam observing unit and the beam irradiation unit, the beam observing unit being configured to observe the alignment laser beam and a shadow of the alignment mark formed by the alignment mark.

16 Claims, 11 Drawing Sheets

LASER INDUCED THERMAL IMAGING APPARATUS AND LASER INDUCED THERMAL IMAGING METHOD

CROSS-REFERENCE TO RELATED APPLICATION

This application claims priority to and the benefit of Korean Patent Application No. 10-2012-0127505 filed in the Korean Intellectual Property Office on Nov. 12, 2012, the entire contents of which are incorporated herein by reference.

BACKGROUND

1. Field

Embodiments relate to a laser thermal imaging apparatus and a laser thermal imaging method.

2. Description of the Related Art

Recently, an organic light emitting diode (OLED) display has received much attention as a display device for displaying images. An organic emission layer included in the OLED display may be formed by using a laser thermal imaging apparatus performing laser induced thermal imaging (LITI).

The above information disclosed in this Background section is only for enhancement of understanding of the background of the described technology and therefore it may contain information that does not form the prior art that is already known in this country to a person of ordinary skill in the art.

SUMMARY

Embodiments are directed to a laser thermal imaging apparatus, including a substrate stage configured to receive a substrate, a beam irradiation unit over the substrate stage, the beam irradiation unit being configured to irradiate an alignment laser beam onto an alignment mark of the substrate, and a beam observing unit facing the beam irradiation unit, the substrate stage being interposed between the beam observing unit and the beam irradiation unit, the beam observing unit being configured to observe the alignment laser beam and a shadow of the alignment mark formed by the alignment mark.

The substrate stage may include a substrate stage hole corresponding to the alignment mark, and the beam observing unit may be positioned corresponding to the substrate stage hole.

The beam observing unit may include a reflection unit corresponding to the substrate stage hole and reflecting the alignment laser beam in a predetermined direction, an observing camera spaced apart from the reflection unit in the predetermined direction, and an observing lens positioned between the reflection unit and the observing camera, the observing lens being configured to enlarge or reduce the alignment laser beam.

The beam observing unit may further include a neutral density filter disposed in an irradiation path of the alignment laser beam.

The apparatus may further include a laser mask interposed between the beam irradiation unit and the substrate stage, the laser mask including an alignment pattern part configured to partition an initial laser beam, irradiated from the beam irradiation unit, into the alignment laser beam.

The apparatus may further include a mask stage between the beam irradiation unit and the substrate stage, the mask stage being configured to receive the laser mask, and a mask alignment camera on the mask stage, the mask alignment camera being configured to confirm alignment of the laser mask.

The laser mask may further include an imaging pattern part neighboring the alignment pattern part, the imaging pattern part being configured to partition the initial laser beam into an imaging laser beam that is irradiated to a display area of the substrate.

A donor film may be disposed on the substrate, the imaging laser beam being configured to irradiate the donor film and thermally image an organic emission layer onto the substrate.

The donor film may be supported by the substrate stage.

The laser mask may include a mask main body, the mask main body including the alignment pattern part and the imaging pattern part, and a cover, the cover being positioned between the mask main body and the beam irradiation unit and being configured to selectively cover the alignment pattern part.

The cover may be configured to slide between an upper region of the alignment pattern part of the mask main body and an outer region of the mask main body.

The substrate stage may be configured to move in a first direction, a second direction crossing the first direction, and a third direction crossing the first direction and the second direction.

The apparatus may further include a main stage, the main stage being configured to support the substrate stage and the beam observing unit, and being configured to move in the first direction and the second direction.

The apparatus may further include a substrate alignment camera on the substrate stage, the substrate alignment camera being configured to confirm alignment of the substrate.

Embodiments are also directed to a laser thermal imaging method, the method including positioning a substrate, irradiating an alignment laser beam onto an alignment mark of the substrate, observing the alignment laser beam and a shadow of the alignment mark formed by the alignment mark, comparing alignment of the shadow of the alignment mark and the alignment laser beam, and aligning at least one of the substrate and the alignment laser beam.

The method may further include performing a laser induced thermal imaging operation whereby an imaging laser beam is irradiated onto a donor film to thermally image an organic emission layer onto the substrate using the aligned substrate or alignment laser beam.

BRIEF DESCRIPTION OF THE DRAWINGS

Features will become apparent to those of skill in the art by describing in detail example embodiments with reference to the attached drawings in which.

DETAILED DESCRIPTION

Figure 1:
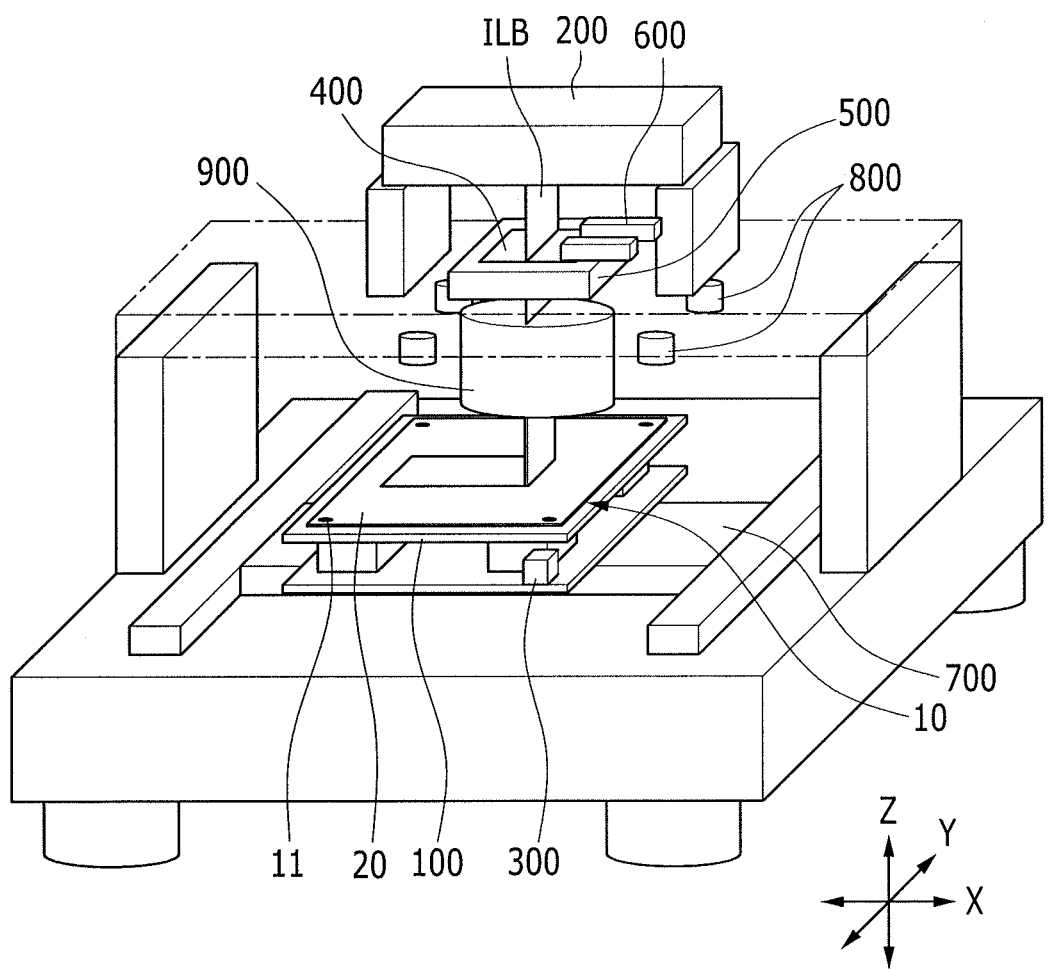
FIG. 1 is a view of a laser thermal imaging apparatus according to a first example embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. Like reference numerals refer to like elements throughout.

Further, since sizes and thicknesses of constituent members shown in the accompanying drawings are arbitrarily given for better understanding and ease of description, the present invention is not limited to the illustrated sizes and thicknesses.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

Now, a laser thermal imaging apparatus according to a first example embodiment will be described with reference to FIG. 1 to FIG. 4.

FIG. 1 is a view of a laser thermal imaging apparatus according to the first example embodiment.

In the example embodiment shown in FIG. 1, the laser thermal imaging apparatus according to the first example embodiment irradiates a laser beam to a donor film 20 disposed on a substrate 10 for thermally imaging an organic emission layer from the donor film 20 to the substrate 10. Here, the substrate 10 may include a material such as a metal, a glass, and/or a polymer. Also, the substrate 10 may include a pixel circuit including a plurality of thin film transistors and one or more capacitors, and a first electrode connected to a pixel circuit. Pixels may include an organic emission layer that is thermally imaged from the donor film 20. The organic emission layer may be formed on the first electrode. After the organic emission layer is formed on the first electrode by using the laser thermal imaging apparatus, a second electrode may be formed on the organic emission layer, and a sealing unit sealing the pixel circuit and an organic light emitting element including the first electrode, the organic emission layer, and the second electrode may be further formed on the second electrode thereby manufacturing an organic light emitting diode (OLED) display.

In the present example embodiment, the donor film 20 is disposed on the substrate 10. The laser thermal imaging apparatus according to the first example embodiment includes a substrate stage 100, a beam irradiation unit 200, a beam observing unit 300, a laser mask 400, a mask stage 500, a mask alignment camera 600, a main stage 700, a substrate alignment camera 800, and an optical system 900.

Figure 2:
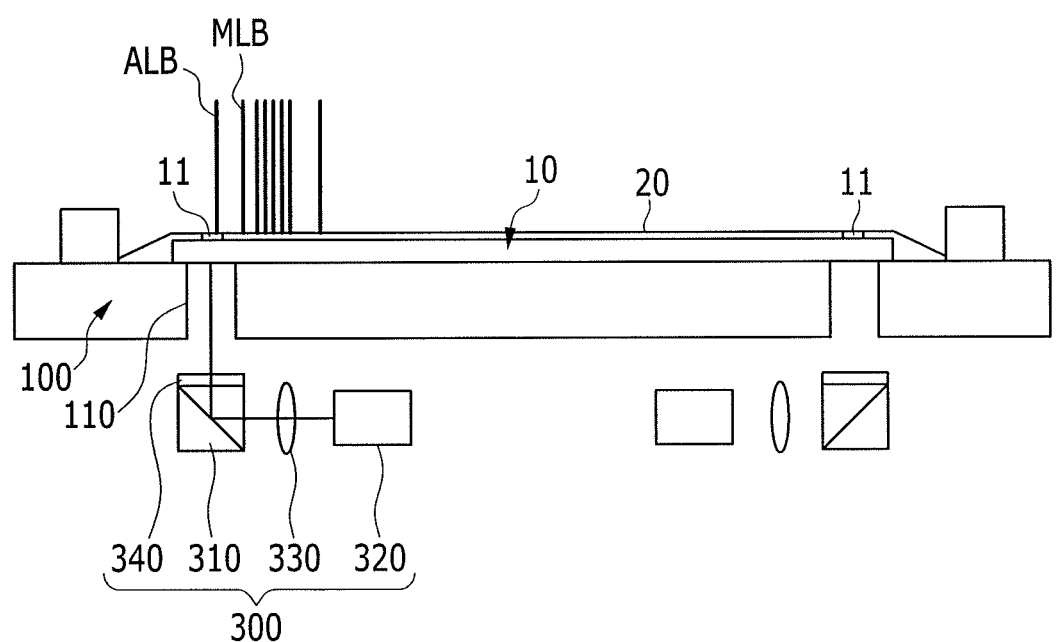
FIG. 2 is a view of a substrate stage side of the laser thermal imaging apparatus shown in FIG. 1.

FIG. 2 is a view of a substrate stage side in the laser thermal imaging apparatus shown in FIG. 1.

As shown in FIG. 1 and FIG. 2, the substrate stage 100 is a part receiving the substrate 10 including an alignment mark 11 and moves in a first direction X, a second direction Y crossing the first direction X, and a third direction Z crossing the first direction X and the second direction Y, thereby performing alignment of the substrate 10 for an alignment laser beam ALB irradiated from the beam irradiation unit 200. Here, the first direction X, the second direction Y, and the third direction Z are directions that are perpendicular to each other or extend at an acute angle or an obtuse angle to each other. The substrate 10 is disposed on the substrate stage 100, and the edge of the donor film 20 positioned on the substrate 10 is fixed to a tray and is supported by the substrate stage 100. The substrate stage 100 includes a substrate stage hole 110 that is opened corresponding to the alignment mark 11 of the substrate 10, and the beam observing unit 300 is positioned while corresponding to the substrate stage hole 110.

The beam irradiation unit 200 is positioned on the substrate stage 100 and irradiates an initial laser beam ILB to the substrate 10. The initial laser beam ILB irradiated from the beam irradiation unit 200 is partitioned into the alignment laser beam ALB and an imaging laser beam MLB by the laser mask 400, and is irradiated to the substrate 10.

The beam observing unit 300 may corresponds to the beam irradiation unit 200 via the substrate stage 100, such that the substrate stage is interposed between the beam observing unit 300 and the beam irradiation unit 200. The beam observing unit 300 may be positioned under the substrate stage 100 corresponding to the substrate stage hole 110 of the substrate stage 100. The beam observing unit 300 observes the alignment laser beam ALB including a shadow of the alignment mark 11 formed by the alignment mark 11 to be stored as an image. The beam observing unit 300 may include a reflection unit 310, an observing camera 320, an observing lens 330, and a neutral density (ND) filter 340.

The reflection unit 310 may be positioned corresponding to the substrate stage hole 110 of the substrate stage 100 to reflect the alignment laser beam ALB passing through the substrate stage hole 110 to the observing camera 320 in a predetermined direction.

The observing camera 320 may be, e.g., a CCD or a CMOS, and observes the alignment laser beam ALB including the shadow of the alignment mark 11. The observing camera may be spaced apart from the reflection unit 310.

The observing lens 330 may be positioned between the reflection unit 310 and the observing camera 320, and may enlarge or reduce the alignment laser beam ALB reflected by the reflection unit 310. The observing lens 330 may determine a phase position of the alignment laser beam ALB including the shadow of the alignment mark 11.

The ND filter 340 may be disposed in an irradiation path of the alignment laser beam ALB to reduces the intensity of the alignment laser beam ALB including the shadow of the alignment mark 11 to help the observing camera 320 to recognize the alignment laser beam ALB and to simultaneously protect the observing camera 320 from being damaged by the alignment laser beam ALB.

The laser mask 400 is positioned between the beam irradiation unit 200 and the substrate stage 100, and partitions the initial laser beam ILB irradiated from the beam irradiation unit 200 into the alignment laser beam ALB and the imaging laser beam MLB.

FIGS. 3A-3B and FIGS. 4A-4B are views to explain the laser mask shown in FIG. 1.

As shown in FIGS. 3A-3B and FIGS. 4A-4B, the laser mask 400 includes a mask main body 410 and a cover 420.

The mask main body 410 includes an alignment pattern part 411 and an imaging pattern part 412.

The alignment pattern part 411 is positioned at an outer region of the mask main body 410 and partitions the initial laser beam ILB irradiated from the beam irradiation unit 200 into the alignment laser beam ALB. The alignment pattern part 411 may have a pattern of various shapes such as a circle or a polygon, and the shape of the alignment laser beam ALB is determined according to the pattern shape of the alignment pattern part 411.

The imaging pattern part 412 neighboring the alignment pattern part 411 is positioned at a center region of the mask main body 410 and partitions the initial laser beam ILB irradiated from the beam irradiation unit 200 into the imaging laser beam MLB. The imaging pattern part 412 has a pattern of various shapes according to the shape of the organic emission layer to be formed on the substrate 10. The imaging laser beam MLB partitioned by the imaging pattern part 412 is irradiated to the display area of the substrate 10 in the laser thermal imaging using the donor film 20.

The cover 420 is positioned between the mask main body 410 and the beam irradiation unit 200, and selectively covers the alignment pattern part 411.

Figure 3A:
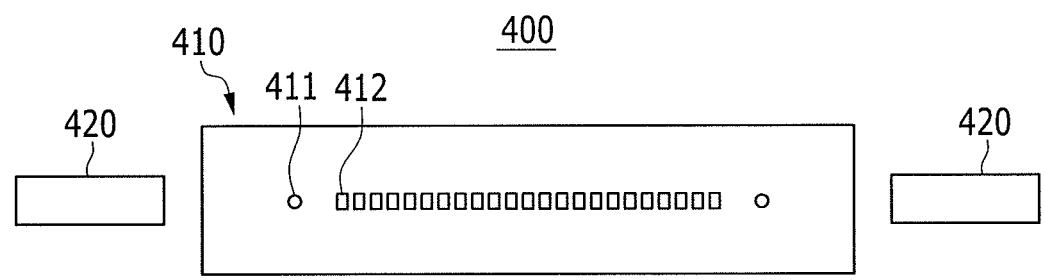
FIGS. 3A-3B and FIGS. 4A-4B are views to explain the laser mask shown in FIG. 1.
Figure 3B:
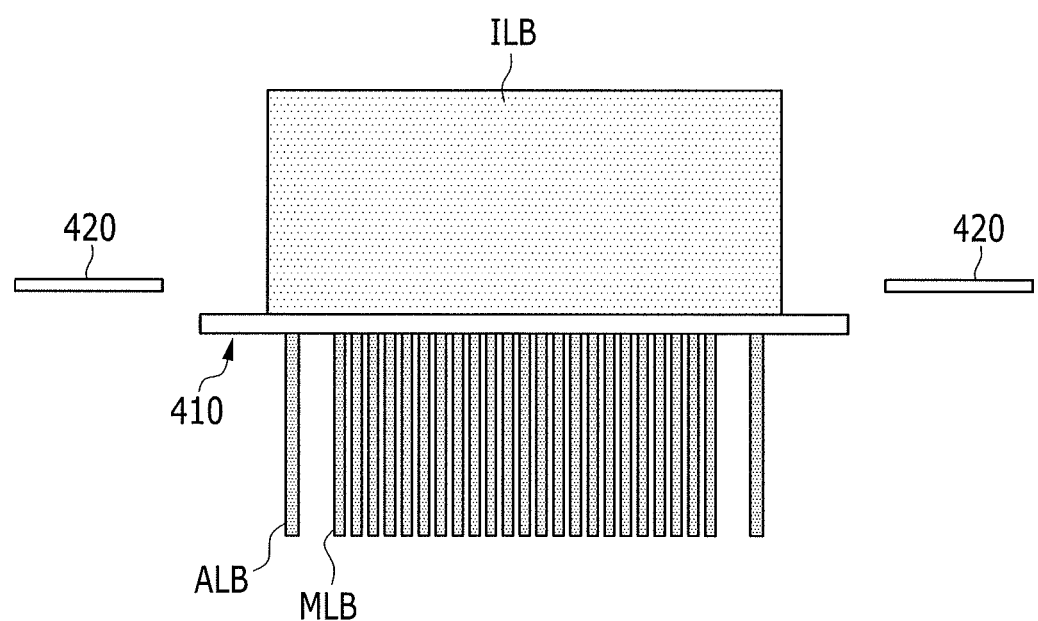

In detail, as shown in FIGS. 3A and 3B, when observing the alignment of the substrate 10 for the alignment laser beam ALB by using the beam observing unit 300, the cover 420 is positioned at the outer region of the mask main body 410.

Figure 4A:
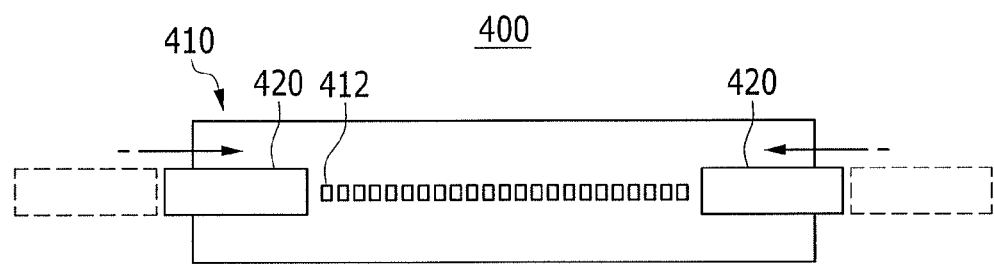
Figure 4B:
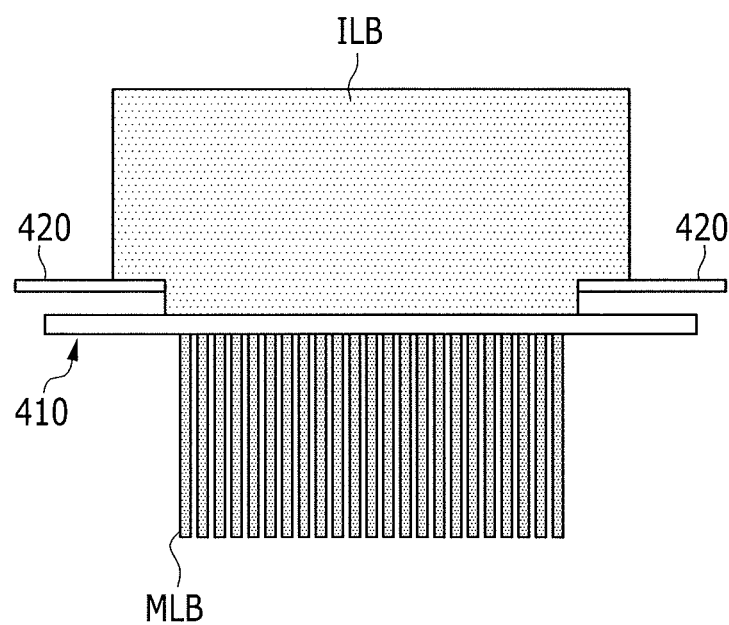

Also, shown in FIGS. 4A and 4B, after the alignment of the substrate 10 for the alignment laser beam ALB, to prevent the transfer of the undesired organic emission layer by the alignment laser beam ALB when transferring the organic emission layer to the substrate 10 by using the imaging laser beam MLB and the donor film 20, the cover 420 is positioned at the upper region of the alignment pattern part 411 of the mask main body 410 to cover the alignment pattern part 411 such that the initial laser beam ILB prevents the alignment pattern part 411 from being transmitted.

Thus, the cover 420 may slide between the upper regions of the alignment pattern part 411 of the mask main body 410 and the outer region of the mask main body 410 to selectively cover the alignment pattern part 411. The sliding of the cover 420 may be performed by a sliding guide part guiding the sliding of the cover 420 and a sliding driver performing sliding driving of the cover 420; for better understanding and ease of description, they are not shown.

Again referring to FIG. 1, the mask stage 500 is positioned between the beam irradiation unit 200 and the substrate stage 100, and the laser mask 400 is provided on the mask stage 500. The mask stage 500 moves in at least one direction among the first direction X, the second direction Y, and the third direction Z, thereby performing the alignment of the laser mask 400 for the initial laser beam ILB.

The mask alignment camera 600 is positioned on the mask stage 500 and may confirm the alignment of the laser mask 400 for the initial laser beam ILB.

The main stage 700 supports the substrate stage 100 and the beam observing unit 300, and may move in the first direction X and the second direction Y. The main stage 700 may be moved in the first direction X and the second direction Y after placement of the substrate 10 and the donor film 20 on the initial substrate stage 100 to perform the alignment of the substrate 10 at a predetermined position.

The substrate alignment camera 800 is positioned on the substrate stage 100 and confirms whether the substrate 10 is aligned at the initial predetermined position. The substrate alignment camera 800 may be provided in plural.

The optical system 900 is positioned between the laser mask 400 and the substrate stage 100, and images the alignment laser beam ALB and the imaging laser beam MLB that are irradiated from the beam irradiation unit 200 and partitioned by the laser mask 400. The optical system 900 may include at least one lens.

Next, referring to FIG. 5 to FIG. 7, a laser thermal imaging method according to the second example embodiment will be described.

The laser thermal imaging method according to the second example embodiment may be performed using the laser thermal imaging apparatus according to the first example embodiment.

Figure 5:
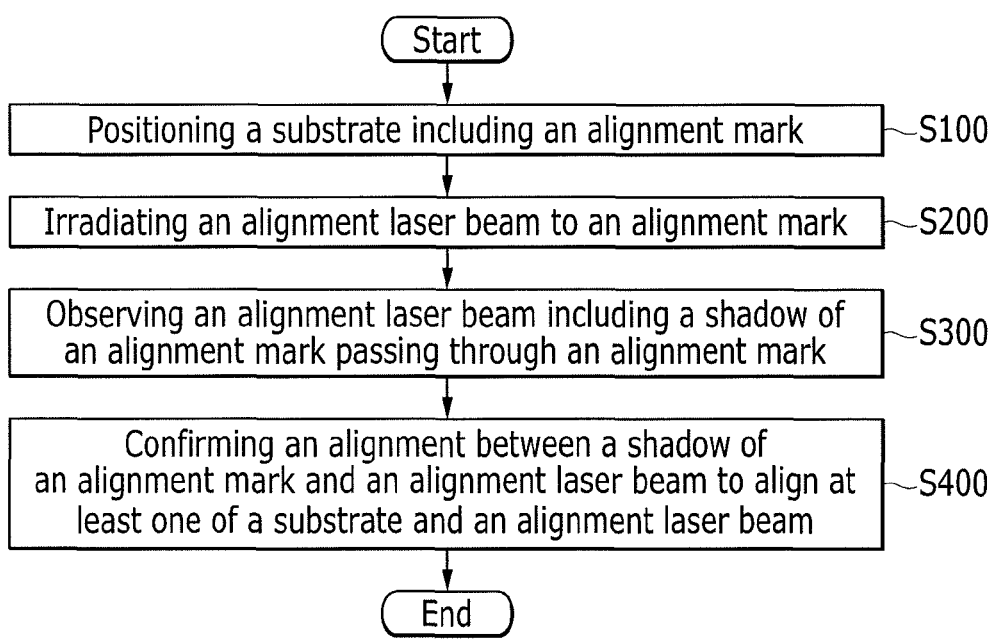
FIG. 5 is a flowchart of a laser thermal imaging method according to a second example embodiment.

FIG. 5 is a flowchart of a laser thermal imaging method according to the second example embodiment.

In the example embodiment shown in FIG. 5, the substrate 10 including the alignment mark 11 is positioned first (S100).

In detail, after the substrate 10 and a donor film 20 are positioned on the substrate stage 100, the main stage 700 is moved in the first direction X or the second direction Y to align the substrate 10 into an initial predetermined position. At this time, the alignment of the substrate 10 is confirmed by using the substrate alignment camera 800 and the alignment of the substrate 10 is performed by using the substrate stage 100.

Next, an alignment laser beam ALB is irradiated to the alignment mark 11 (S200).

In detail, after the alignment of the laser mask 400 is confirmed by using the mask alignment camera 600 and the alignment of the laser mask 400 is performed by using the mask stage 500, the initial laser beam ILB is irradiated from the beam irradiation unit 200 to the laser mask 400 to irradiate the alignment laser beam ALB to the alignment mark 11 of the substrate 10.

FIGS. 6A-6B and FIGS. 7A-7B are views to explain a laser thermal imaging method according to the second example embodiment.

Next, as shown in FIGS. 6A-6B and FIGS. 7A-7B, the alignment laser beam ALB including a shadow AMS of the alignment mark 11 is observed (S300).

Figure 6A:
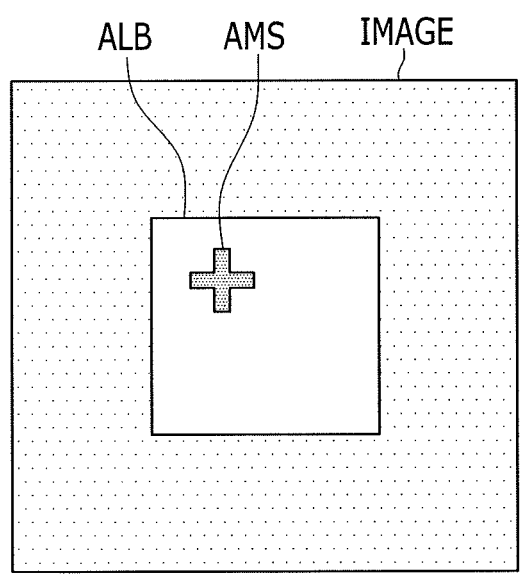
FIGS. 6A-6B and FIGS. 7A-7B are views to explain a laser thermal imaging method according to the second example embodiment.
Figure 7A:
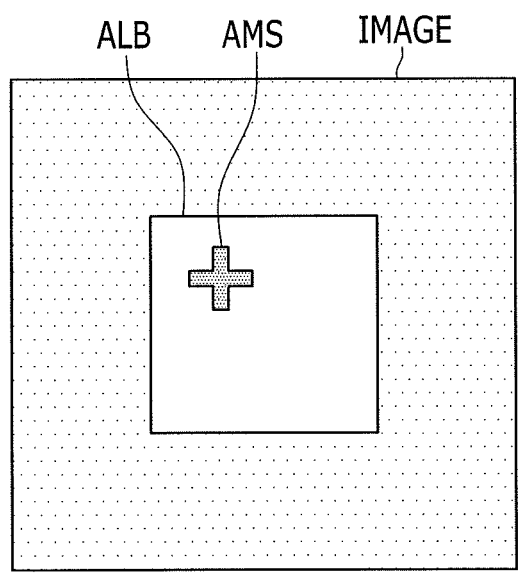

In detail, in FIG. 6A or FIG. 7A, the alignment laser beam ALB including the shadow AMS of the alignment mark 11 formed by the alignment mark 11 of the substrate 10 is stored as an image IMAGE by the beam observing unit 300, and the image IMAGE is observed and the alignment between the alignment laser beam ALB and the shadow AMS of the alignment mark 11 is observed. At this time, although the alignment of the substrate 10 by the main stage 700, the alignment of the substrate 10 by the substrate stage 100, and the alignment of the laser mask 400 by the mask stage 500 have been previously performed, the substrate stage 100, the beam irradiation unit 200, the beam observing unit 300, the laser mask 400, the mask stage 500, the mask alignment camera 600, the main stage 700, the substrate alignment camera 800, the optical system 900, etc., forming the laser thermal imaging apparatus, may be deformed by vibration generated in the previous laser thermal imaging method or a force or heat applied from the surroundings such that an alignment error may be generated between the alignment laser beam ALB and the shadow AMS of the alignment mark 11. As such, next, at least one of the substrate 10 and the alignment laser beam ALB is aligned by confirming the alignment of the shadow AMS of the alignment mark 11 and the alignment laser beam ALB (S400).

Figure 6B:
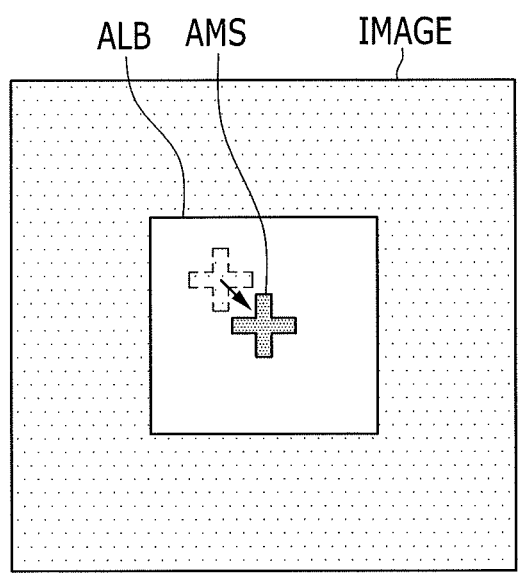
Figure 7B:
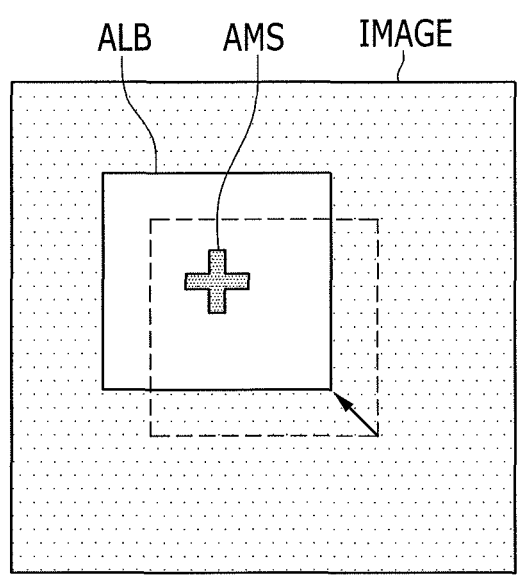

In detail, when storing the image IMAGE that is performed with the alignment by the beam observing unit 300, as shown in FIG. 6B, the alignment between the shadow AMS of the alignment mark 11 and the alignment laser beam ALB is performed by moving the alignment laser beam ALB, or as shown in FIG. 7B, the alignment between the shadow AMS of the alignment mark 11 and the alignment laser beam ALB is performed by moving the substrate 10.

As described above, by performing the alignment between the shadow AMS of the alignment mark 11 and the alignment laser beam ALB, the alignment of the imaging laser beam MLB for the substrate 10 is performed.

Next, the alignment pattern part 411 of the laser mask 400 is covered by using the cover 420, and the organic emission layer is thermally imaged from the donor film 20 to the substrate 10 by using the imaging laser beam MLB.

As described above, the laser thermal imaging apparatus may include the substrate stage 100, the beam irradiation unit 200, and the beam observing unit 300, although the laser mask 400, the mask stage 500, the mask alignment camera 600, the main stage 700, the substrate alignment camera 800, the optical system 900, etc. In the laser thermal imaging apparatus according to the first example embodiment and the laser thermal imaging method according to the second example embodiment, one or more components may be deformed or displaced (e.g., by a vibration generated in the previous laser thermal imaging method or by the force or the heat applied from the surroundings) such that an alignment error is generated between the alignment laser beam ALB and the shadow AMS of the alignment mark 11. Thus, at least one of the substrate 10 and the alignment laser beam ALB is aligned by confirming the alignment between the shadow AMS of the alignment mark 11 and the alignment laser beam ALB using the beam observing unit 300 to perform the alignment of the imaging laser beam MLB for the substrate 10. Accordingly, the alignment of the substrate 10 for the imaging laser beam MLB may be performed without alignment error although the surroundings are unintentionally deformed.

By way of summation and review, a general laser thermal imaging apparatus may include an alignment camera confirming alignment of a substrate, a beam irradiation unit irradiating a laser beam to the substrate, and an optical system positioned between the beam irradiation unit and the substrate. The general laser thermal imaging apparatus may confirms the alignment of the substrate for the laser beam by using the alignment camera. However, the alignment camera, the beam irradiation unit, and the optical system forming the laser thermal imaging apparatus may not be an ideal rigid body, such that a deformation may be generated (e.g., by vibration generated in the laser thermal imaging method or a force or heat that is applied from surroundings) in the alignment camera, beam irradiation unit, optical system, etc., thereby causing an error of the alignment of the substrate for the laser beam.

As described above, embodiments relate to a laser thermal imaging apparatus for forming an organic emission layer on a substrate by using a donor film, and a laser thermal imaging method. Example embodiments provide a laser thermal imaging apparatus performing alignment of a substrate for a laser beam even though surroundings may be unintentionally deformed, and a laser thermal imaging method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A laser thermal imaging apparatus, comprising:
a substrate stage configured to receive a substrate;
a beam irradiation unit over the substrate stage, the beam irradiation unit being configured to irradiate an alignment laser beam onto an alignment mark of the substrate; and
a beam observing unit facing the beam irradiation unit, the substrate stage being interposed between the beam observing unit and the beam irradiation unit, the beam observing unit being configured to observe the alignment laser beam and a shadow of the alignment mark formed by the alignment mark.

2. The apparatus as claimed in claim 1, wherein:
the substrate stage includes a substrate stage hole corresponding to the alignment mark, and
the beam observing unit is positioned corresponding to the substrate stage hole.

3. The apparatus as claimed in claim 2, wherein the beam observing unit includes:
a reflection unit corresponding to the substrate stage hole and reflecting the alignment laser beam in a predetermined direction,
an observing camera spaced apart from the reflection unit in the predetermined direction, and
an observing lens positioned between the reflection unit and the observing camera, the observing lens being configured to enlarge or reduce the alignment laser beam.

4. The apparatus as claimed in claim 3, wherein the beam observing unit further includes a neutral density filter disposed in an irradiation path of the alignment laser beam.

5. The apparatus as claimed in claim 1, further comprising a laser mask interposed between the beam irradiation unit and the substrate stage, the laser mask including an alignment pattern part configured to partition an initial laser beam, irradiated from the beam irradiation unit, into the alignment laser beam.

6. The apparatus as claimed in claim 5, further comprising:
a mask stage between the beam irradiation unit and the substrate stage, the mask stage being configured to receive the laser mask; and
a mask alignment camera on the mask stage, the mask alignment camera being configured to confirm alignment of the laser mask.

7. The apparatus as claimed in claim 5, wherein the laser mask further includes an imaging pattern part neighboring the alignment pattern part, the imaging pattern part being configured to partition the initial laser beam into an imaging laser beam that is irradiated to a display area of the substrate.

8. The apparatus as claimed in claim 7, wherein a donor film is disposed on the substrate, the imaging laser beam being configured to irradiate the donor film and thermally image an organic emission layer onto the substrate.

9. The apparatus as claimed in claim 8, wherein the donor film is supported by the substrate stage.

10. The apparatus as claimed in claim 7, wherein the laser mask includes:
a mask main body, the mask main body including the alignment pattern part and the imaging pattern part; and
a cover, the cover being positioned between the mask main body and the beam irradiation unit and being configured to selectively cover the alignment pattern part.

11. The apparatus as claimed in claim 10, wherein the cover is configured to slide between an upper region of the alignment pattern part of the mask main body and an outer region of the mask main body.

12. The apparatus as claimed in claim 1, wherein the substrate stage is configured to move in a first direction, a second direction crossing the first direction, and a third direction crossing the first direction and the second direction.

13. The apparatus as claimed in claim 12, further comprising a main stage, the main stage being configured to support the substrate stage and the beam observing unit, and being configured to move in the first direction and the second direction.

14. The apparatus as claimed in claim 12, further comprising a substrate alignment camera on the substrate stage, the substrate alignment camera being configured to confirm alignment of the substrate.

15. A laser thermal imaging method, the method comprising:
    positioning a substrate;
    irradiating an alignment laser beam onto an alignment mark of the substrate;
    observing the alignment laser beam and a shadow of the alignment mark formed by the alignment mark;
    comparing alignment of the shadow of the alignment mark and the alignment laser beam; and
    aligning at least one of the substrate and the alignment laser beam.

16. The method as claimed in claim 15, further comprising performing a laser induced thermal imaging operation whereby an imaging laser beam is irradiated onto a donor film to thermally image an organic emission layer onto the substrate using the aligned substrate or alignment laser beam.

* * * * *